United States Patent
Kuo

(10) Patent No.: US 7,852,680 B2
(45) Date of Patent: Dec. 14, 2010

(54) OPERATING METHOD OF MULTI-LEVEL MEMORY CELL

(75) Inventor: Ming-Chang Kuo, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 387 days.

(21) Appl. No.: 12/017,573

(22) Filed: Jan. 22, 2008

(65) Prior Publication Data

US 2009/0185428 A1  Jul. 23, 2009

(51) Int. Cl.
*G11C 16/06* (2006.01)
(52) U.S. Cl. .................. 365/185.22; 365/185.18; 365/185.03; 365/185.24
(58) Field of Classification Search ............ 365/185.22, 365/185.18, 185.03, 185.24
See application file for complete search history.

(56) References Cited

U.S. PATENT DOCUMENTS

| 6,011,725 | A | 1/2000 | Eitan |
| 6,243,298 | B1 * | 6/2001 | Lee et al. ............... 365/185.28 |
| 7,170,795 | B2 | 1/2007 | Lee |
| 2007/0103990 | A1 | 5/2007 | Lee |
| 2008/0025090 | A1 * | 1/2008 | Lee et al. ............... 365/185.03 |
| 2008/0144370 | A1 * | 6/2008 | Park et al. ............. 365/185.03 |
| 2008/0225589 | A1 * | 9/2008 | Aritome et al. ........ 365/185.03 |

FOREIGN PATENT DOCUMENTS

| TW | 556196 | 10/2003 |
| TW | 200514086 | 4/2005 |
| TW | 200615950 | 5/2006 |

OTHER PUBLICATIONS

Phines: A Novel Low Power Program/Erase, Small Pitch, 2-Bit per cell Flash Memory, Yeh et al., Electron Devices Meeting, 2002,IEDM'02 Digest, International pp. 931-934, 2002.
Electrically Alterable Avalanch-Injection-Type MOS Readonly Memory with Stacked-Gate Structure, Iizuka et al., IEEE, TFLANSACTIONS on Electron Device vol. ED-23, No. 4, Apr. 19, 1976.

* cited by examiner

*Primary Examiner*—Tuan T Nguyen
*Assistant Examiner*—Toan Le
(74) *Attorney, Agent, or Firm*—J.C. Patents

(57) ABSTRACT

An operating method of a memory cell is described, wherein the memory cell has a plurality of threshold voltages. The operating method includes programming the cell from an initial state to a programmed state. The initial state is an erased state having a threshold voltage between the lowest threshold voltage and the highest one among the plurality of threshold voltages.

19 Claims, 7 Drawing Sheets

OPERATING METHOD OF MULTI-LEVEL MEMORY CELL

BACKGROUND OF THE INVENTION

1. Field of the Invention

This invention relates to an operating method of a multi-level memory cell.

2. Description of Related Art

Among various memory products, non-volatile memory has been widely applied to personal computers and various consumer electronic devices since it can be written and erased many times and the written data can be retained when the power is off.

The floating gate and the control gate of an electrically erasable programmable read-only memory (EEPROM) are made of doped polysilicon. Since the floating gate is made of conductive doped polysilicon which allows injected electrons or holes to be delocalized, each memory cell in such a memory device has data states "1" and "0" only, i.e., stores only one bit of data.

Conventionally, a floating gate made of polysilicon may be replaced by a charge trapping layer. Generally, the charge-trapping layer is made of silicon nitride and silicon oxide layers are respectively disposed on and under the charge-trapping layer, so that an oxide-nitride-oxide (ONO) composite layer is formed. Such a device is called a silicon/oxide/nitride/oxide/silicon (SONOS) device. Due to the trapping effect of silicon nitride, electrons injected into the charge-rapping layer are localized in certain regions thereof. In a typical SONOS memory cell, two bits can be respectively stored in two portions of the silicon nitride layer respectively close to the drain and the source. However, when one bit has been stored in the portion of the silicon nitride layer close to the drain, a second bit effect will be produced when reverse reading is performed, and thus the silicon nitride layer has to be wide enough to avoid the second bit effect. As a result, neither the size nor the fabrication cost of the memory device can be reduced.

SUMMARY OF THE INVENTION

Accordingly, this invention is directed to an operating method of a multi-level memory cell, which prevents a second bit effect so that both the size and the fabrication cost of a memory device are reduced and the storage density thereof is increased.

The memory cell to which the operating method of this invention is applied has a plurality of threshold voltages. The operating method includes programming the memory cell from an initial state to a programmed state. The initial state is an erased state having a threshold voltage between the lowest one and the highest one among the plurality of threshold voltages.

According to an embodiment, when the memory cell is to be programmed to a programmed state having a threshold voltage lower than that of the initial state, the memory cell may be programmed through double side bias (DSB) hole injection, band-to-band hot hole injection or negative Fowler-Nordheim (−FN) electron tunneling.

According to an embodiment, the operating method further includes verifying the programmed state using a lowest program verify level.

According to an embodiment, the threshold voltage (Vt) of the programmed state is lower than the lowest program verify level.

According to an embodiment, the Vt of the programmed state is between the lowest program verify level and an erase verify level for verifying the erased state.

According to an embodiment, when the memory cell is to be programmed to a programmed state having Yt higher than that of the initial state, the cell is programmed through DSB electron injection, channel hot electron (CHE) injection or FN tunneling.

According to an embodiment, the operating method further includes verifying the programmed state using a highest program verify level.

According to an embodiment, the Vt of the programmed state is higher than the highest program verify level.

According to an embodiment, the Vt of the programmed state is between the highest program verify level and the erase verify level for verifying the erased state.

Another operating method of a memory cell of this invention includes using an erase verify level to determine whether the cell is at an erased state or not and using the lowest program verify level and the highest program verify level to determine whether the cell is at one of a plurality of programmed states or not. The erase verify level is between the lowest program verify level and the highest one.

According to an embodiment, one of the programmed states has a threshold voltage lower than the lowest program verify level.

According to an embodiment, one of the programmed states has a threshold voltage higher than the highest program verify level.

According to an embodiment, one of the programmed states has a threshold voltage between the highest program verify level and the erase verify level.

According to an embodiment, one of the programmed states has a threshold voltage between the lowest program verify level and the erase verify level.

According to an embodiment, the operating method further includes using an initial state verify level to determine whether the cell is at an initial state or not. The initial state verify level is the erase verify level.

Still another operating method of a memory cell of this invention is applied to a memory cell having at least two programmed states, including defining the limits of the programmed states to a highest state and a lowest state and operating the memory cell to an initial state between the highest state and the lowest state.

According to an embodiment, the initial state is an erased state.

According to an embodiment, the memory cell is programmed to the initial state through DSB convergence or −FN electron tunneling.

According to an embodiment, the operating method further includes verifying the initial state using an erase verify level.

In the operating method of this invention, a second bit effect is avoided so that both the size and the fabrication cost of a memory device are reduced and the storage density thereof is increased.

In order to make the aforementioned and other objects, features and advantages of the present invention comprehensible, a preferred embodiment accompanied with figures is described in detail below.

DESCRIPTION OF THE EMBODIMENTS

Figure 1:
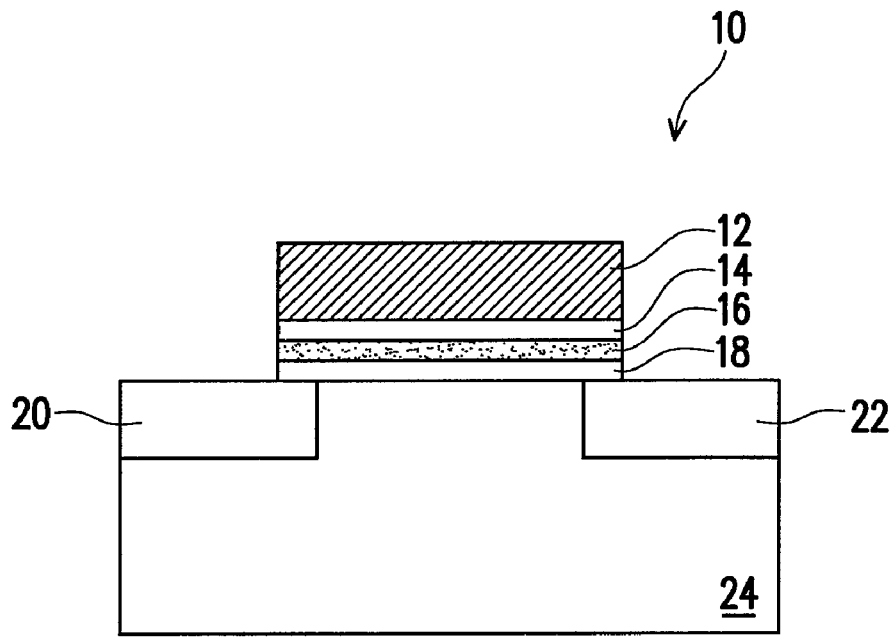
FIG. 1 is a cross-sectional view of a conventional memory cell.

Reference will now be made in detail to the present preferred embodiments of this invention, examples of which are illustrated in the accompanying drawings. Wherever possible, the same reference numbers are used in the drawings and the description to refer to the same or like parts.

FIG. 1 is a cross-sectional view of a conventional memory cell suitable for the operating method of this invention. The memory cell 10 such as a multi-level memory cell includes a control gate 12 over a substrate 24, a charge storage layer 16 between the control gate 12 and the substrate 24, and a source region 20 and a drain region 22 in the substrate 24 at both sides of the control gate 12. A dielectric layer 14 may be disposed between the control gate 12 and the charge storage layer 16. A tunneling dielectric layer 18 may be disposed between the charge storage layer 16 and the substrate 24. In an embodiment, the charge storage layer 16 is a dielectric layer, such as a silicon nitride layer, which acts as a charge-trapping layer for confining the injected holes or electrons within certain regions (localization). The memory cell 10 may be a silicon/oxide/nitride/oxide/silicon (SONOS) device when the charge storage layer 16 is a silicon nitride layer. In another embodiment, the charge storage layer 16 is a conductive layer, such as a doped polysilicon layer, which acts as a floating gate allowing the injected holes or electrons to be distributed therein evenly (delocalization). The memory cell may be a flash memory device when the charge storage layer 16 is a conductive layer.

Figure 2:
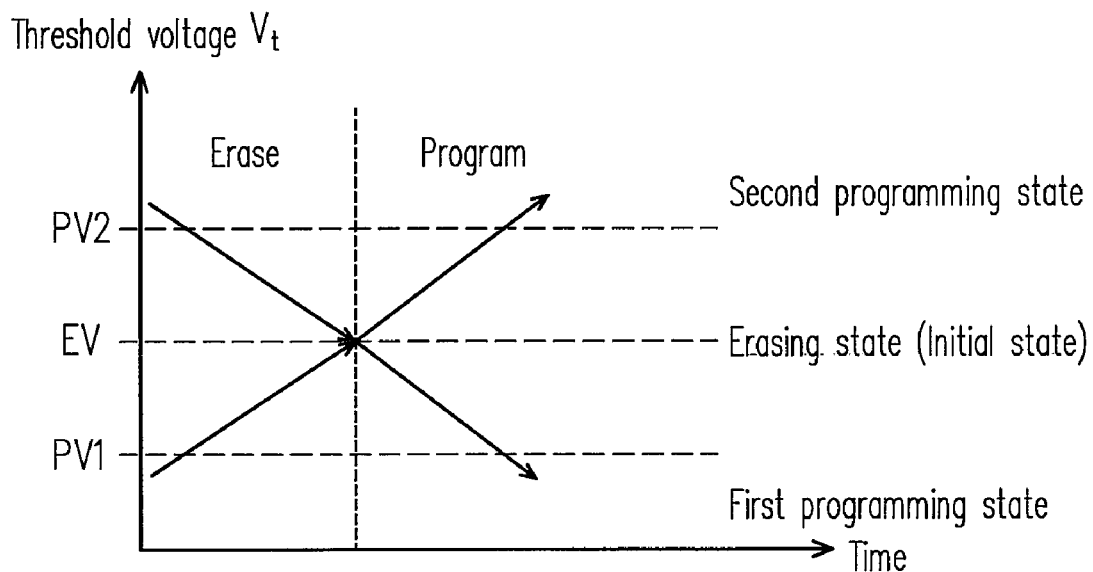
FIG. 2 shows different states of a memory cell according to a first embodiment of this invention.

FIG. 2 shows different states of a memory cell according to the first embodiment of this invention.

The memory cell in this embodiment has three threshold voltages corresponding to three data states. A lowest threshold voltage is defined for a first programmed state. A highest threshold voltage is defined for a second programmed state. A threshold voltage between the lowest threshold voltage and highest one is defined for an erased state. When data is to be erased from the cell, biases are applied to the cell to make it at the erased state. When the charge storage layer of the memory cell is a dielectric layer, the data therein can be erased through double side bias (DSB) convergence. When the charge storage layer is a conductor, electrons stored therein can be ejected through −FN electron tunneling so as to erase the data from the cell.

After the erasing operation, a verify operation is performed using an erase verify level EV. The threshold voltage Vt of a memory cell erased to the erased state should be within a margin of EV possibly satisfying "$0.01V \leq |Vt-EV| \leq 0.1V$".

In this invention, the erased state is defined as an initial state. Before the memory cell is programmed, a verify operation is performed using an initial state verify level that is the erase verify level EV. The Vt of the cell initialized to the initial state should be within a margin of EV possibly satisfying "$0.01V \leq |Vt-EV| \leq 0.1V$".

In the programming, biases are applied to the cell to program it from the initial state to the first or second programmed state. When the charge storage layer of the memory cell is a dielectric layer, the cell is programmed to the first programmed state through DSB hole injection or band-to-band hot hole (BTBHH) injection, or to the second programmed state through DSB electron injection or CHE injection. When the charge storage layer is a conductor, the cell is programmed to the first programmed state through DSB hole injection or −FN electron tunneling, or to the second programmed state through DSB electron injection, CHE injection or FN electron injection.

After the programming, another verify operation is performed. In the operation, the Vt of a cell programmed to the first programmed state is verified with a lowest program verify level PV1. The Vt of such a cell should be lower than PV1. Further, the Vt of a cell programmed to the second programmed state is verified with a highest program verify level PV2. The Vt of such a cell should be higher than PV2.

Figure 3:
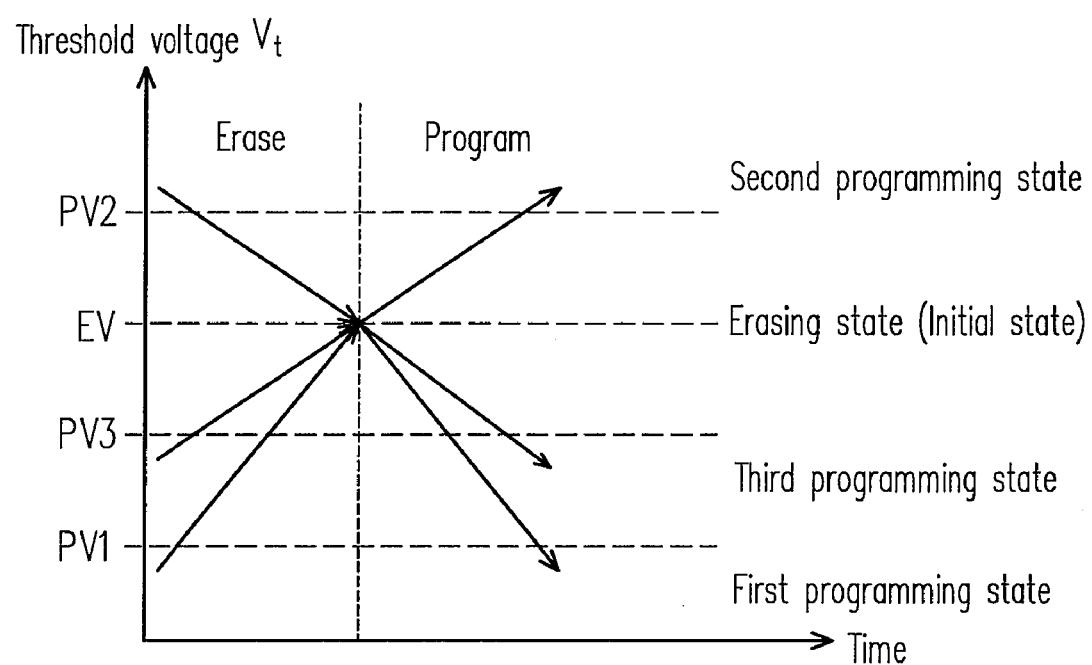
FIG. 3 illustrates different states of a 4-level memory cell according to a second embodiment of this invention.

FIG. 3 illustrates different states of a 4-level memory cell according to the second embodiment of this invention.

Referring to FIG. 3, the cell in this embodiment has four Vts corresponding to four data states. The state with the lowest Vt is defined as a first programmed state. The state with the highest Vt is defined as a second programmed state. A state with a Vt between the lowest threshold voltage and highest one is defined as an erased state. Except the first and the second programmed states and the erased state, the cell further has a third programmed state with a Vt between the lowest Vt and the Vt of the initial state. In an embodiment, the first programmed state is defined as 11-state, the third programmed state is defined as 10-state, the initial state is defined as 01-state, and the second programmed state is defined as 00-state.

To erase data from the memory cell, biases are applied to the same to make it at the erased state. When the charge storage layer of the cell is a dielectric layer, the cell can be erased through DSB convergence. As the charge storage layer is a conductor, electrons stored therein can be ejected through −FN electron tunneling.

Figure 3A:
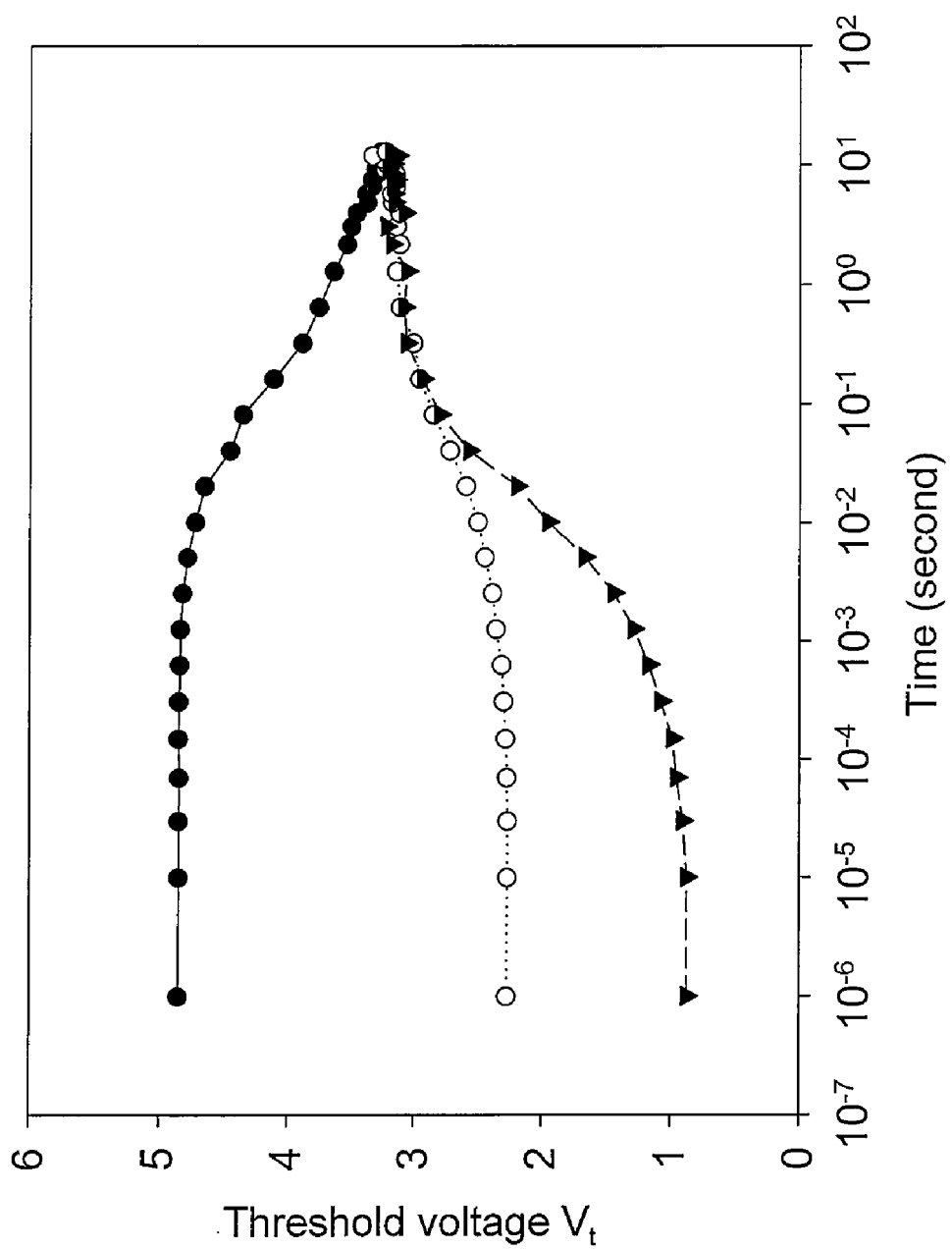
FIG. 3A shows the Vt-variations of a 4-level memory cell with time when the cell is erased from different programmed states in an example according to the second embodiment of this invention.

In an embodiment, the charge storage layer is a dielectric layer and thus data can be erased through DSB convergence. In the erase operation, a bias, for example −2V to 2V, is applied to the control gate, a higher bias, for example 4V to 7V, is applied to both of the source region and the drain region, and a bias, for example 0V, is applied to the substrate. Hot holes are generated from the junctions of the source region and the drain region and accelerated toward the substrate to generate electron-hole pairs. If the cell is at an over-programmed state, the holes are attracted into the charge storage layer eliminating some electrons therein. If the cell is at an over-erased state, the electrons are attracted into the charge storage layer eliminating some holes therein. Thus, in the erasing, the Vt of the cell converges to that of the erase state through DSB convergence, and the relationship between the threshold voltage and time is exemplified in FIG. 3A.

After the erasing operation, a verify operation is performed using an erase verify level EV. The Vt of a cell erased to the erased state should be within a margin of EV satisfying "$0.01V \leq |Vt-EV| \leq 0.1V$".

In this embodiment, the erased state is defined as an initial state. Before the cell is programmed, a verify operation is performed with an initial state verify level that is the erase verify level EV. The Vt of a cell initialized to the initial state should be within a margin of EV satisfying $0.01V \leq |Vt-EV| \leq 0.1V$.

Referring to FIG. 3, to program the cell, biases are applied thereto to program the same from the initial state to the first, second or third programmed state.

When the charge storage layer is a dielectric layer, the cell is programmed to the first or third programmed state through DSB hole injection or BTBHH injection, or to the second programmed state through DSB electron injection or CHE injection. As the charge storage layer is a conductor, the cell is programmed to the $1^{st}$ or $3^{rd}$ programmed state through DSB hole injection or –FN electron tunneling, or to the $2^{nd}$ programmed state through DSB electron injection, CHE injection or FN electron injection.

Figure 3B:
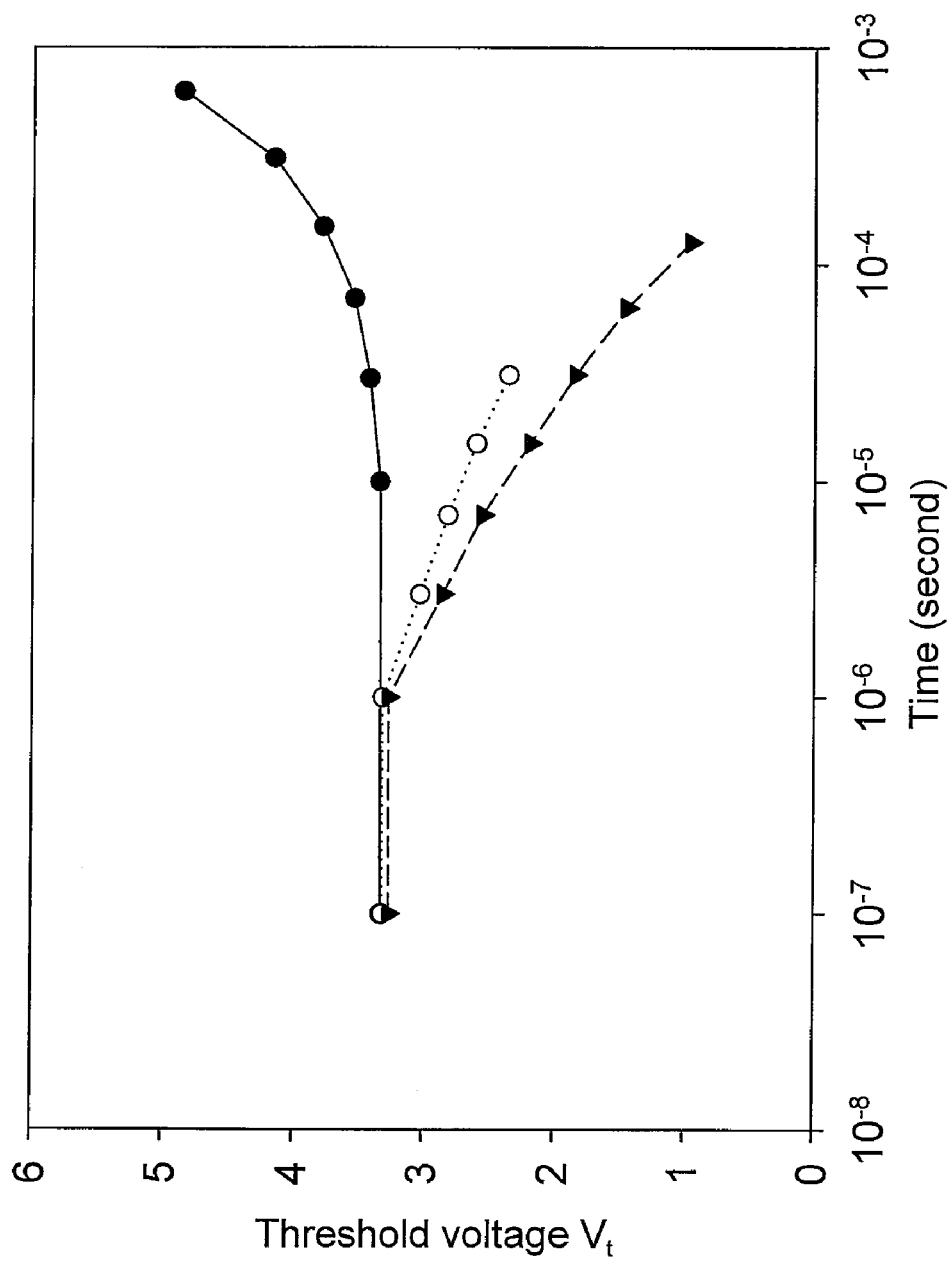
FIG. 3B shows the Vt-variations of a 4-level memory cell with time when the cell is programmed to different states in the same example.

In an embodiment, the charge storage layer is a dielectric layer. When the cell is programmed, the Vt thereof may be reduced through DSB hole injection. In this operating, a negative bias, for example –8V to –12V, is applied to the control gate, a positive bias, for example 4V to 6V, is applied to both of the source region and the drain region, and a bias, for example 0V, is applied to the substrate. Hot holes are generated from the junctions of the source region and the drain region and accelerated toward the substrate to generate electron-hole pairs. The holes are attracted by the negative bias applied to the control gate and are thus injected and trapped in the charge storage layer. As a result, the Vt of the cell is reduced to that of the first or third programmed state. Or, the Vt of the cell is raised through DSB electron injection. In this operating, a positive bias, for example 8V to 12V, is applied to the control gate, another positive bias, for example 4V to 6V, is applied to both of the source region and the drain region, and a bias, for example 0V, is applied to the substrate. Hot holes are generated from the junctions of the source and the drain regions and accelerated toward the substrate to generate electron-hole pairs. The electrons are attracted by the positive bias applied to the control gate and are thus injected and trapped in the charge storage layer. As a result, the Vt thereof is raised to that of the second programmed state. The relationship between the Vt of the cell and time is exemplified in FIG. 3B.

After the programming, another verify operation is performed. In the operation, the Vt of a cell programmed to the first programmed state is verified with a lowest program verify level PV1, and the Vt of such a cell should be lower than PV1. The Vt of a cell programmed to the $2^{nd}$ programmed state is verified with a highest program verify level PV2, and the Vt of such a cell should be higher than PV2. In addition, the Vt of a cell programmed to the third programmed state is verified with the lowest program verify level PV1 and a program verify level PV3 between PV1 and the erase verify level EV, and the Vt of such a cell should be between PV1 and PV3.

Figure 4:
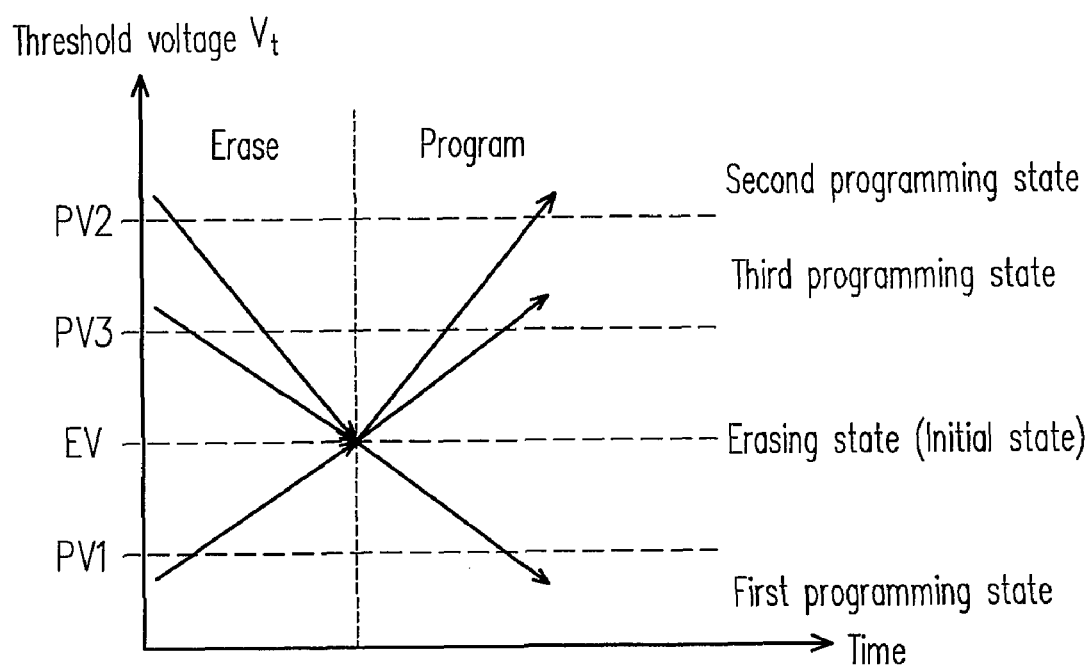
FIG. 4 illustrates different states of a 4-level memory cell according to a third embodiment of this invention.

FIG. 4 illustrates different states of a 4-level memory cell according to a third embodiment of this invention.

Referring to FIG. 4, the cell in this embodiment also has four Vts corresponding to four data states. The state with the lowest Vt is defined as a first programmed state. The state with the highest Vt is defined as a second programmed state. A state with a Vt between the lowest Vt and highest Vt is defined as an erased state. Except the first and second programming states and erased state, the cell further has a third programmed state with a threshold voltage between the highest Vt and the Vt of the initial state. In an embodiment, the first programmed state is defined as 11-state, the initial state is defined as 10-state, the third programmed state is defined as 01-state and the second programmed state is defined as 00-state.

To erase data from the memory cell, biases are applied to the same to make it at the erased state. When the charge storage layer is a dielectric layer, the cell can be erased through DSB convergence. When the charge storage layer is a conductor, the electrons therein can be ejected through –FN electron tunneling.

Figure 4A:
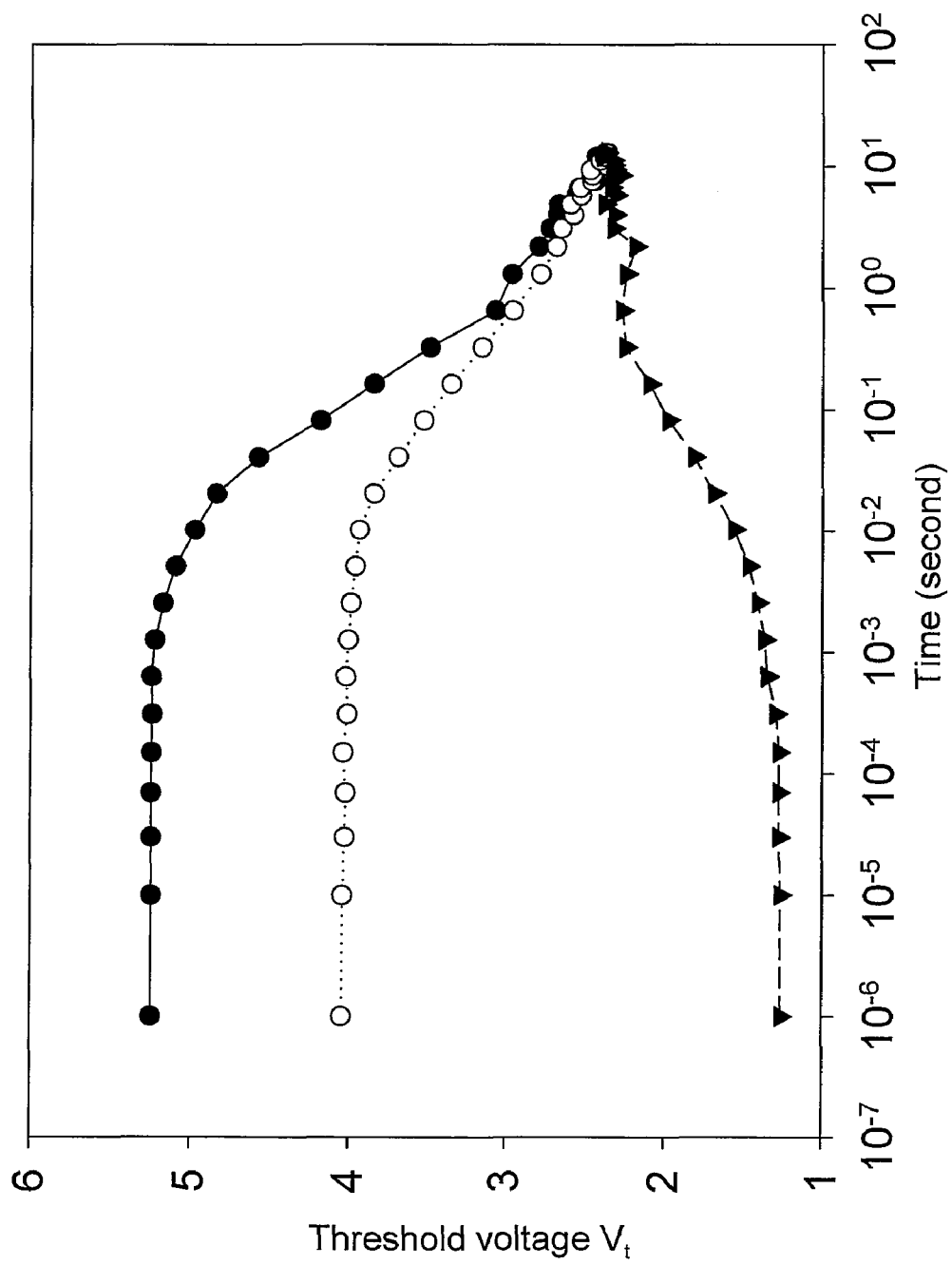
FIG. 4A shows the Vt-variations of a 4-level memory cell with time when the cell is erased from different programmed states in an example according to the third embodiment of this invention.

In an embodiment where the charge storage layer is a dielectric layer, data can be erased from the cell through DSB convergence. In the erasing, a bias, for example –2V to 2V, is applied to the control gate, a higher bias, for example 4V to 7V, is applied to both of the source region and the drain region, and a bias, for example 0V, is applied to the substrate. Hot holes are generated from the junctions of the source region and the drain region and accelerated toward the substrate to generate electron-hole pairs. If the memory is at an over-programmed state, holes are attracted into the charge storage layer eliminating some electrons therein. If the memory is at an over-erased state, electrons are attracted in the charge storage layer eliminating some holes therein. Thus, the Vt of the cell converges to that of the erased state through DSB convergence. The relationship between the threshold voltage and time is exemplified in FIG. 4A.

After the erasing operation, a verify operation is performed using an erase verify level EV. The Vt of a cell erased to the erased state should be within a margin of EV satisfying "$0.01V \leq |Vt-EV| \leq 0.1V$".

In this embodiment, the erased state is defined as an initial state. Before the cell is programmed, a verify operation is performed using an initial state verify level that is the erase verify level EV. The Vt of a cell initialized to the initial state should be within a margin of EV satisfying "$0.01V \leq |Vt-EV| \leq 0.1V$".

Referring to FIG. 4, in the programming, biases are applied to the memory cell to program the same from the initial state to the first, second or third programming state.

When the charge storage layer is a dielectric layer, the cell is programmed to the first programmed state through DSB hole injection or BTBHH injection, or to the second or third programmed state through DSB electron injection or CHE injection. When the charge storage layer is a conductor, the cell is programmed to $1^{st}$ programmed state with DSB hole injection or –FN electron tunneling, or to $2^{nd}$ or $3^{rd}$ programmed state through DSB electron injection, CHE injection or FN electron injection.

Figure 4B:
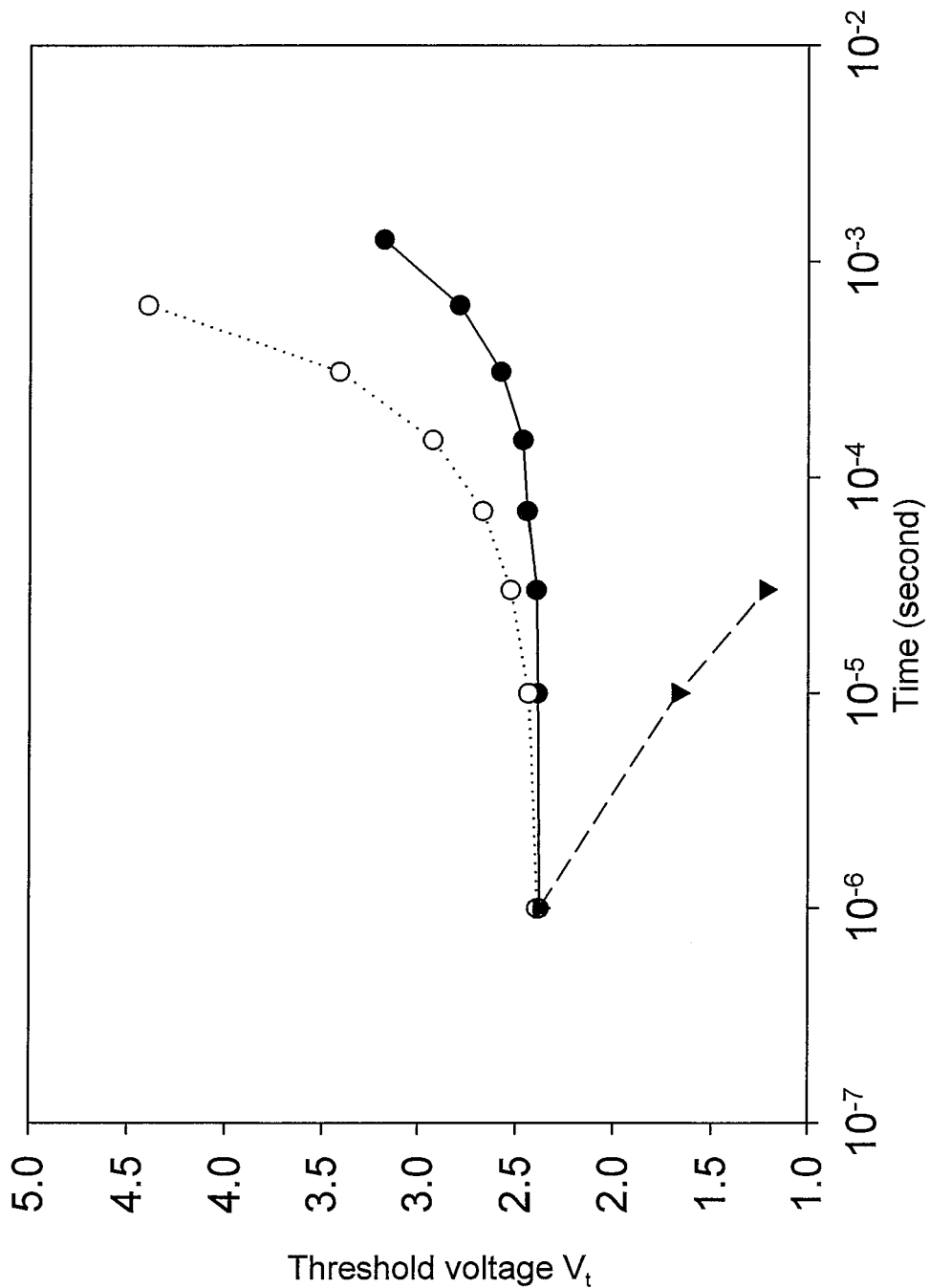
FIG. 4B shows the Vt-variations of a 4-level memory cell with time when the cell is programmed to different states in the same example.

In an embodiment where the charge storage layer is a dielectric layer, in the programming, the Vt of the cell may be reduced through DSB hole injection. In this operating, a negative bias, for example –8V to –12V, is applied to the control gate, a positive bias, for example 4V to 6V, is applied to both of the source region and the drain region, and a bias, for example 0V, is applied to the substrate. Hot holes are generated from the junctions of the source region and the drain region and accelerated toward the substrate to generate electron-hole pairs. The holes are attracted by the negative bias applied to the control gate and are thus injected and trapped in the charge storage layer. As a result, the Vt of the cell is lowered to that of the first programmed state. Or, the Vt of the cell is raised through DSB electron injection. In this operating, a positive bias, for example 8V to 12V, is applied to the control gate, a positive bias, for example 4V to 6V, is applied to both of the source region and the drain region, and a bias, for example 0V, is applied to the substrate. Hot holes are generated from the junctions of the source region and the drain region and accelerated toward the substrate to generate electron-hole pairs. The electrons are attracted by the positive bias applied to the control gate and are thus injected and trapped in the charge storage layer. As a result, the Vt of the cell is raised to that of the second or third programmed states. The relationship between the Vt of the cell and time is exemplified in FIG. 4B.

After the programming, another verify operation is performed. In the operation, the Vt of a cell programmed to the first programmed state is verified with the lowest program verify level PV1, and the Vt of such a cell should be lower than PV1. Further, the Vt of a cell programmed to the second programmed state is verified with the highest program verify level PV2, and the Vt of such a cell should be higher than PV2. In addition, the Vt of a cell programmed to the third programmed state is verified with the highest program verify level PV2 and a program verify level PV3 between PV2 and the erasing verify level EV, and the Vt of such a cell should be between PV2 and PV3.

In the operating method provided by this invention, the state of a memory cell can be determined according to different threshold voltages thereof. Thereby, each memory cell can have four different states, namely two bits.

In this invention, the state of a cell can be determined according to different threshold voltages thereof. Thereby, a cell can have more than one bits and a second bit effect can be avoided. Accordingly, both the size and fabrication cost of a memory device can be reduced and the storage density thereof can be increased.

In this invention, the Vt of a cell can converge to that of an initial state between the highest Vt and the lowest Vt through DSB convergence or −FN electron tunneling, so that no extra step is required to narrow the Vt-distribution in the initial state. Moreover, in this invention, a memory cell is always programmed from the initial state with a middle Vt relative to the other states. Thus, the time required for programming the memory cell is reduced.

In overview, with the operating method provided by this invention, a target state can be reached precisely and the distribution of the threshold voltage can be narrowed.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. An operating method of a memory cell that has a plurality of threshold voltages, comprising:
   programming the memory cell from an initial state to one of a plurality of programmed state, wherein the initial state is an erased state having a threshold voltage larger than a lowest threshold voltage of the plurality of programmed state and lower than a highest threshold voltage of the plurality of programmed state.

2. The operating method of claim 1, wherein when the memory cell is to be programmed to the programmed state having a threshold voltage lower than the threshold voltage of the initial state, the memory cell is programmed through DSB hole injection, band-to-band hot hole (BTBHH) injection, or negative Fowler-Nordheim (−FN) electron tunneling.

3. The operating method of claim 2, further comprising verifying the programmed state using a lowest program verify level.

4. The operating method of claim 3, wherein the threshold voltage of the programmed state is lower than the lowest program verify level.

5. The operating method of claim 3, wherein the threshold voltage of the programmed state is between the lowest program verify level and an erase verify level for verifying the erased state.

6. The operating method of claim 1, wherein when the memory cell is to be programmed to the programmed state having a threshold voltage higher than the threshold voltage of the initial state, the memory cell is programmed through double side bias (DSB) electron injection, channel hot electron (CHE) injection, or Fowler-Nordheim (FN) tunneling.

7. The operating method of claim 6, further comprising verifying the programmed state using a highest program verify level.

8. The operating method of claim 7, wherein the threshold voltage of the programmed state is higher than the highest program verify level.

9. The operating method of claim 7, wherein the threshold voltage of the programmed state is between the highest program verify level and an erase verify level for verifying the erased state.

10. An operating method of a memory cell, comprising:
    using an erase verify level to determine whether the memory cell is at an erased state or not, wherein the erase verify level is between a lowest program verify level and a highest program verify level; and
    using the lowest program verify level and the highest program verify level to determine whether the memory cell is at one of a plurality of programmed states or not.

11. The operating method of claim 10, wherein one of the programmed states has a threshold voltage lower than the lowest program verify level.

12. The operating method of claim 10, wherein one of the programmed states has a threshold voltage higher than the highest program verify level.

13. The operating method of claim 10, wherein one of the programmed states has a threshold voltage between the highest program verify level and the erase verify level.

14. The operating method of claim 10, wherein one of the programmed states has a threshold voltage between the lowest program verify level and the erase verify level.

15. The operating method of claim 10, further comprising using an initial state verify level to determine an initial state, wherein the initial state verify level is the erase verify level.

16. An operating method of a memory cell that has at least two programmed states, comprising:
    defining limits of the programmed states to a highest state and a lowest state; and
    operating the memory cell to a threshold voltage of an initial state lower than a highest threshold voltage of the highest state and higher than a lowest threshold voltage of the lowest state.

17. The operating method of claim 16, wherein the initial state is an erased state.

18. The operating method of claim 16, wherein operating the memory cell to the initial state utilizes DSB convergence or negative Fowler-Nordheim (−FN) electron tunneling.

19. The operating method of claim 16, further comprising verifying the initial state using an erase verify level.

* * * * *